(12) United States Patent
Labanc et al.

(10) Patent No.: US 11,770,892 B2
(45) Date of Patent: Sep. 26, 2023

(54) HIGH-FREQUENCY AMPLIFIER ASSEMBLY FOR A HIGH-FREQUENCY GENERATOR

(71) Applicant: COMET AG, Flamatt (CH)

(72) Inventors: Anton Labanc, Ehrenkirchen (DE); Daniel Gruner, Müllheim (DE)

(73) Assignee: COMET AG, Flamatt (CH)

( * ) Notice: Subject to any disclaimer, the term of this patent is extended or adjusted under 35 U.S.C. 154(b) by 320 days.

(21) Appl. No.: 17/176,414

(22) Filed: Feb. 16, 2021

(65) Prior Publication Data
US 2021/0259090 A1 Aug. 19, 2021

(30) Foreign Application Priority Data
Feb. 17, 2020 (DE) .................... 10 2020 104 090.3

(51) Int. Cl.
*H05H 1/46* (2006.01)
*H03F 3/19* (2006.01)

(52) U.S. Cl.
CPC ................. *H05H 1/46* (2013.01); *H03F 3/19* (2013.01); *H05H 2242/20* (2021.05)

(58) Field of Classification Search
None
See application file for complete search history.

(56) References Cited

U.S. PATENT DOCUMENTS

| | | | | |
|---|---|---|---|---|
| 6,329,757 B1* | 12/2001 | Morrisroe | ............ | H03B 5/1296 219/121.48 |
| 8,482,205 B2* | 7/2013 | Kirchmeier | ............. | H05H 1/46 315/111.21 |
| 9,522,282 B2* | 12/2016 | Chow | ................. | A61N 1/3787 |
| 9,748,909 B2* | 8/2017 | Akizuki | ................... | H04B 1/16 |
| 2004/0112350 A1* | 6/2004 | Schleupen | ............. | F02P 9/007 123/606 |
| 2004/0129696 A1* | 7/2004 | Doi | .................... | G03G 15/2053 219/619 |
| 2004/0149735 A1* | 8/2004 | Ogasawara | ........ | G03G 15/2053 219/619 |
| 2004/0155612 A1* | 8/2004 | Krichtafovitch | ......... | H05H 1/24 315/501 |

(Continued)

FOREIGN PATENT DOCUMENTS

| | | |
|---|---|---|
| DE | 10336881 A1 | 3/2005 |
| DE | 60011874 T2 | 8/2005 |

(Continued)

*Primary Examiner* — Srinivas Sathiraju
(74) *Attorney, Agent, or Firm* — The Webb Law Firm

(57) ABSTRACT

The high-frequency amplifier assembly for a high-frequency generator, in particular for a high-frequency generator for operating a plasma generator, is provided with a signal generator for generating a high-frequency signal; a first amplifier transistor for amplifying the signal generated by the signal generator; an output terminal for outputting the amplified signal to an external load; an input network arranged between the signal generator and the first amplifier transistor for providing the high-frequency signal at the input of the amplifier transistor; an output network arranged between the amplifier transistor and the external load for providing a desired load impedance for the amplifier transistor; and an electronic voltage-limiting assembly arranged at the output terminal for limiting the output voltage at the output terminal.

16 Claims, 10 Drawing Sheets

(56) References Cited

U.S. PATENT DOCUMENTS

| | | | | |
|---|---|---|---|---|
| 2007/0037532 | A1* | 2/2007 | Ziegler | H01J 37/32174 455/111 |
| 2010/0171428 | A1* | 7/2010 | Kirchmeier | H02M 7/5383 315/111.21 |
| 2012/0212291 | A1* | 8/2012 | Wilson | H03F 3/189 330/69 |
| 2014/0292179 | A1* | 10/2014 | Katsuraya | F02P 23/04 313/141 |
| 2014/0320016 | A1* | 10/2014 | Chang | H01J 37/32541 315/111.41 |
| 2015/0250046 | A1* | 9/2015 | Habu | H01J 37/321 315/111.21 |
| 2016/0066404 | A1* | 3/2016 | Habu | H05H 1/36 315/223 |
| 2016/0226454 | A1* | 8/2016 | Mastantuono | H03F 1/42 |
| 2016/0300695 | A1* | 10/2016 | Alt | H01L 29/7835 |
| 2017/0005631 | A1* | 1/2017 | Akizuki | H03F 3/195 |
| 2017/0302245 | A1* | 10/2017 | Sadler | H03H 7/383 |
| 2018/0120889 | A1* | 5/2018 | Grede | G06F 1/025 |
| 2018/0122621 | A1* | 5/2018 | Grede | H01J 37/32174 |
| 2018/0123526 | A1* | 5/2018 | Grede | H03F 3/193 |
| 2018/0138804 | A1* | 5/2018 | Kress | H02M 3/157 |
| 2018/0138869 | A1* | 5/2018 | Grede | H01L 23/66 |
| 2019/0186455 | A1* | 6/2019 | Lowery | H05H 1/46 |
| 2019/0187493 | A1* | 6/2019 | Mactaggart | H03F 3/45179 |
| 2019/0311885 | A1* | 10/2019 | Yuzurihara | H03H 7/40 |
| 2019/0357341 | A1* | 11/2019 | Ryu | H05H 1/36 |
| 2021/0074529 | A1* | 3/2021 | Labanc | H01J 37/3299 |
| 2021/0075380 | A1* | 3/2021 | Labanc | H01J 37/32174 |
| 2021/0118649 | A1* | 4/2021 | Huh | H01J 37/32183 |
| 2021/0259090 | A1* | 8/2021 | Labanc | H01J 37/32146 |
| 2022/0060160 | A1* | 2/2022 | Gruner | H01J 37/32174 |
| 2022/0396156 | A1* | 12/2022 | Cho | H02M 7/219 |

FOREIGN PATENT DOCUMENTS

| | | | | |
|---|---|---|---|---|
| DE | 102015007696 B3 | 12/2016 | | |
| WO | WO-2015056366 A1 * | 4/2015 | | H03F 1/0222 |

* cited by examiner

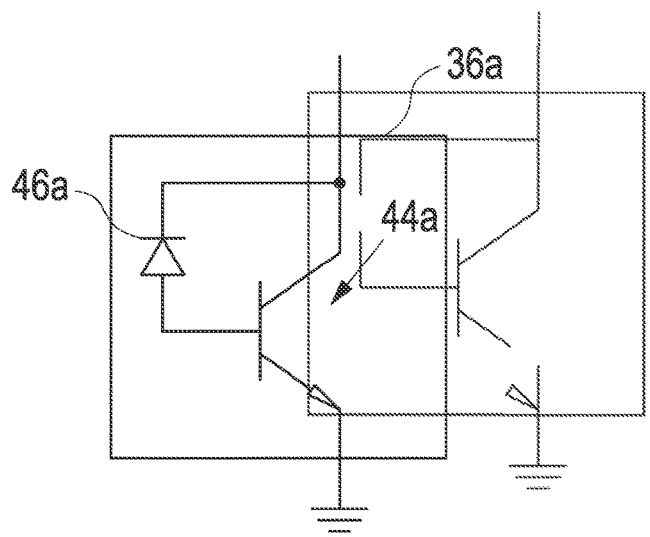
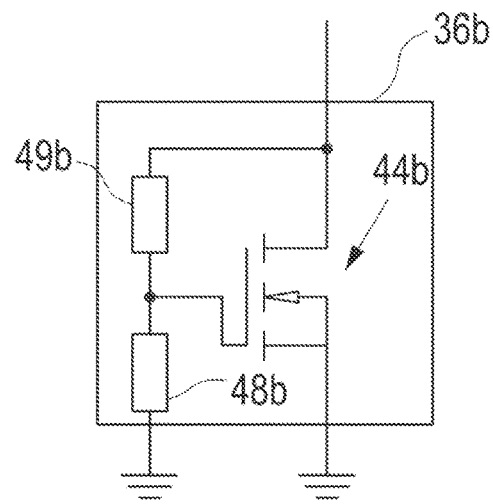
Fig. 8A                    Fig. 8B
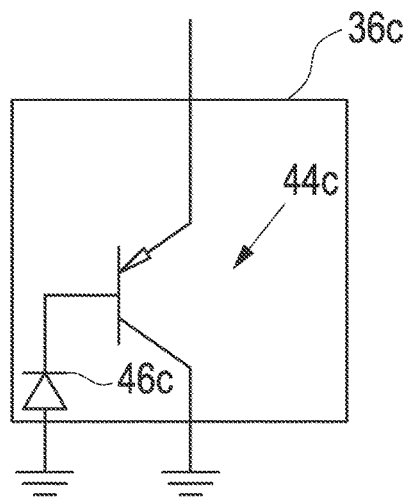
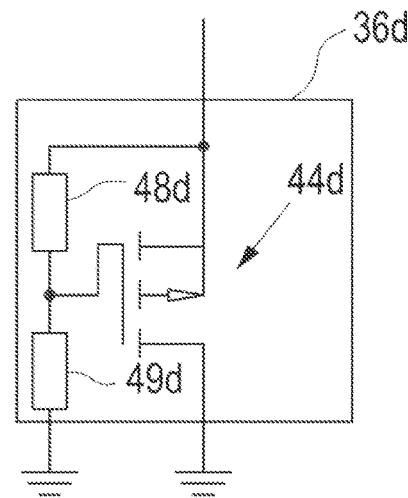
Fig. 8C                    Fig. 8D

HIGH-FREQUENCY AMPLIFIER ASSEMBLY FOR A HIGH-FREQUENCY GENERATOR

CROSS-REFERENCE TO RELATED APPLICATION

This application claims priority to German Patent Application No. 10 2020 104 090.3 filed Feb. 17, 2020, the disclosure of which is hereby incorporated by reference in its entirety.

BACKGROUND

Field of the Invention

The present invention relates to a high-frequency amplifier assembly for a high-frequency generator, a corresponding high-frequency generator having a high-frequency amplifier assembly, as well as a plasma system having a high-frequency generator.

Description of Related Art

High-frequency assemblies are generally known and are used for various applications. In particular, the demands made on a high-frequency amplifier assembly are particularly high when they are used for operating plasma generators.

This is attributable to the fact that the amplifier transistors used in the high-frequency amplifier assemblies can be easily destroyed if they are not protected in an appropriate manner. The destruction of an amplifier transistor can have various reasons. In particular, excessively high voltages at the transistor terminals and/or excessively high currents flowing through the transistor can result in a destruction of an amplifier transistor.

A serious problem occurring during the use of a high-frequency amplifier assembly for operation of a plasma generator is that the produced plasma represents a highly instationary load. As a rule, this results in at least a portion of the fed power being reflected such that high currents can at least temporarily flow through the amplifier transistor of the high-frequency amplifier assembly and can destroy the amplifier transistor and/or the entire high-frequency amplifier assembly.

Consequently, the service life of high-frequency amplifier assemblies is often not as long as desired.

It is therefore an object of the present invention to provide a high-frequency amplifier assembly which is particularly stable and has a long service life.

SUMMARY OF THE INVENTION

For achieving the aforementioned object, the present invention suggests a high-frequency amplifier assembly for a high-frequency generator, in particular for a high-frequency generator for operating a plasma generator, comprising
  a signal generator for generating a high-frequency signal;
  a first amplifier transistor for amplifying the signal generated by the signal generator;
  an output terminal for outputting the amplified signal to an external load;
  an input network arranged between the signal generator and the first amplifier transistor for providing the high-frequency signal at the input of the first amplifier transistor;
  an output network arranged between the first amplifier transistor and the external load for providing a desired load impedance for the first amplifier transistor; and
  an electronic voltage-limiting assembly arranged at the output terminal for limiting the output voltage at the output terminal.

Providing the electronic voltage-limiting assembly at the output terminal ensures that the current flowing through the amplifier transistor is also limited. This is attained by the output network inverting the impedance of the external load such that the desired load impedance is provided at the first amplifier transistor. Consequently, a limitation of the output voltage to a predefined maximum value results in the current flowing through the first transistor amplifier also being limited to a maximum value. Since the voltage-limiting assembly is arranged at the output terminal, it is thus ensured that no excessively high currents can flow through the amplifier transistor and thus destroy the latter.

The signal generator according to the present invention is designed for generating a high-frequency signal with a frequency of typically 100 kHz to 200 MHz. The high-frequency signal generated by the signal generator is provided by the input network at the input of the amplifier transistor. The input network can in particular include a transformer. Furthermore, the input network according to some embodiments of the invention can include additional inductors and capacitors which can serve for impedance matching. The signal generated by the signal generator is amplified by a first amplifier transistor, wherein the amplifier transistor can in particular be configured as a field effect transistor (FET) and preferably as a MOSFET (metal oxide semiconductor FET). In particular, the first amplifier transistor can be configured as an LDMOS (laterally diffused metal oxide semiconductor) FET or as a VDMOS (vertically diffused metal oxide semiconductor) FET. The amplified signal is outputted to an external load via an output terminal. Between the amplifier transistor and the external load an output network is arranged which can in particular include a transformer and, optionally, additional coils and/or capacitors. The output network serves for providing the desired load impedance for the amplifier transistor. The output network is usually designed such that a higher impedance of the external load is converted into a lower impedance suitable for the amplifier transistor.

The electronic voltage-limiting assembly arranged at the output terminal serves for preventing the output voltage at the output terminal from being increased to a value exceeding a predefined value or at least limiting the increase to a value not exceeding a predefined value. Within the framework of the invention, numerous different circuit variants can be used for realizing the technical function of the electronic voltage-limiting assembly. Although the present invention is described in connection with one amplifier transistor for providing a better understanding of the invention, in some embodiments of the invention two or more than two amplifier transistors can be used. According to the invention, it can in particular be provided that two amplifier transistors are used which are interconnected in a push-pull arrangement. According to some embodiments of the invention, it can be provided that the voltage-limiting assembly arranged at the output terminal is not directly connected to the output terminal but that individual components are arranged between the output terminal and the electronic voltage-limiting assembly such that in this case the voltage-limiting assembly is merely indirectly (e.g. galvanically, capacitively or inductively) connected to the output terminal. Within the framework of the present invention, it is merely important that the electronic voltage-limiting assembly arranged on the output side fulfills the functions of voltage limitation and therefore contributes to the limitation of the current flowing through the amplifier transistor.

Preferably, it is provided that the voltage-limiting assembly comprises a load via which at least part of the increased voltage at the output terminal can drop. Thereby, the effective impedance at the voltage-limiting assembly is reduced and the load impedance of the amplifier transistor is increased such that a smaller current flows through the amplifier transistor. The load can in particular be configured as an essentially capacitive load.

Preferably, it is provided that the voltage-limiting assembly comprises a first rectifier diode and a first capacitor connected in series to the first rectifier diode. The rectifier diode can preferably be a high-frequency silicon carbide diode having a very high breakdown voltage. The breakdown voltage can in particular be larger than 500 V, and preferably larger than 1 kV. This arrangement allows for transmitting part of the temporarily increased voltage to the first capacitor during a half-wave of the periodic output signal, thus reducing the voltage at the output terminal in a timely average. Thereby, the current flowing through the amplifier transistor is also reduced. Hence, the first capacitor is further charged during each period. If the capacitor has a relatively high capacitance, at least temporary voltage increases can be compensated for via the first capacitor.

Preferably, it is provided that the voltage-limiting assembly comprises a first discharge assembly for discharging the first capacitor, which first discharge assembly is connected in parallel to the first capacitor. This offers the advantage that thus the voltage-limiting assembly can even compensate for voltage increases occurring over an extended period of time. According to the present invention, the capacitance of the capacitor can typically range between 100 pF and 1 nF. The selected capacitance range offers the advantage that, on the one hand, the first capacitor is charged during several periods and, on the other hand, the capacitance of the first capacitor is not excessively high such that it does not noticeably affect the pulsed operation. The use of the first discharge assembly enables the first capacitor to be discharged once a predefined voltage is reached. The discharge assembly can in particular comprise an ohmic resistor or a voltage-dependent resistor (for example, a diode or a varistor).

Preferably, it is provided that the capacitance of the first capacitor ranges between 1 pF and 100 nF, and in particular between 10 pF and 10 nF. The proper selection of the capacitance of the capacitor ensures a particularly efficient voltage limitation at the output terminal.

Preferably, it is provided that the first discharge assembly comprises a first ohmic resistor for discharging the first capacitor. The first ohmic resistor can, on the one hand, be connected to the first capacitor and, on the other hand, to a ground connection. In this manner, the first capacitor can be discharged via the first ohmic resistor. The resistor can in particular assume a value ranging between 5 and 100 k$\Omega$, preferably between 10 and 50 k$\Omega$, and particularly preferably be 25 k$\Omega$.

Preferably, it is provided that the discharge assembly comprises a first discharge diode for discharging the first capacitor. The discharge diode can preferably be an avalanche diode or a Zener diode. The use of a discharge diode can ensure a particularly rapid discharge of the capacitor. The selection of the breakdown voltage of the discharge diode can further help to adjust in a simple manner the limit voltages above which the discharge assembly is to be activated. The discharge diode can, on the one hand, be connected to the first capacitor and, on the other hand, to a ground connection.

Preferably, it is provided that the first rectifier diode and the first discharge diode are arranged such that the cathode of the first rectifier diode is connected to the cathode of the first discharge diode or that the anode of the first rectifier diode is connected to the anode of the first discharge diode.

Preferably, it is provided that the discharge assembly comprises two or more than two diodes connected in series or connected in parallel. The use of several diodes enables a further improvement of the heat dissipation. The diodes can in particular be configured as avalanche diodes or Zener diodes.

Preferably, it is provided that the voltage-limiting assembly is connected to ground.

Preferably, it is provided that voltage-limiting assembly includes two parallel-connected subassemblies, wherein
the first subassembly includes
a first rectifier diode; and
a first parallel connection being serially connected to the first rectifier diode and comprising a first capacitor and a first discharge assembly; wherein
the cathode of the first rectifier diode is connected to the first parallel connection; and
the second subassembly includes
a second rectifier diode; and
a second parallel connection being serially connected to the second rectifier diode and comprising a second capacitor and a second discharge assembly; wherein
the anode of the second rectifier diode is connected to the second parallel connection.

Here, the first discharge assembly and the second discharge assembly can each in particular comprise an ohmic resistor and/or a diode and/or a varistor which are arranged in parallel to the respective capacitors. Furthermore, the first discharge assembly and/or the second discharge assembly can comprise a combination of a discharge transistor and a driving diode. The possible arrangements of the discharge transistors and the driving diodes will be explained in detail below. Further, it can be provided that the first discharge assembly includes a first ohmic resistor and a first discharge diode which are arranged in parallel to the first capacitor. Here, the cathode of the first rectifier diode is connected to the cathode of the first discharge diode. Accordingly, the second discharge assembly includes in particular a second ohmic resistor and a second discharge diode which are arranged in parallel to the second capacitor. Here, the anode of the discharge diode is connected to the anode of the rectifier diode. The use of two rectifier diodes, where the anode side of the first diode is arranged at the output terminal and the cathode side of the second diode is connected to the output terminal, allows for compensating for the increased voltages both during the positive half-wave of the output signal and during the negative half-wave of the output signal through the first and the second capacitor. Thereby, a particularly efficient limitation of the voltage at the output terminal can be ensured.

Preferably, it is provided that the discharge assembly comprises a varistor for discharging the first capacitor or is exclusively composed of a varistor for discharging the first capacitor.

Preferably, it is provided that the discharge assembly comprises a first discharge diode for discharging the first capacitor as well as a driving diode for driving the first discharge diode. The combination of the discharge transistor and the driving diode can be used instead of the discharge diode or in addition to the latter. The use of a discharge transistor offers the advantage that it can dissipate very high power and furthermore has a high reaction rate.

Preferably, it is provided that the first discharge transistor is configured as an npn bipolar transistor, wherein the anode of the driving diode is connected to the base of the npn bipolar transistor and the cathode of the driving diode is connected to the collector of the npn bipolar transistor. In this way, the driving diode can be used for driving the npn bipolar transistor once a predefined voltage at the driving diode is exceeded.

Preferably, it is provided that a driving resistor is provided which is arranged in parallel to the driving diode. Thereby, the discharge transistor can continuously discharge the first capacitor with a small current. Thereby, the first ohmic resistor which is arranged in parallel to the capacitor can be replaced such that the power loss is received by the transistor and its cooling body.

Preferably, it is provided that the discharge assembly comprises a first discharge transistor which is configured as an nMOS transistor, wherein the gate of the nMOS transistor is driven via a resistance divider. Here, the resistance divider comprises two resistors, wherein one resistor is arranged between the gate and the drain of the nMOS transistor and the other resistor is arranged between the gate of the nMOS transistor and the ground connection.

Preferably, it is provided that the first discharge transistor is arranged on a cooling element which is provided for dissipating the heat generated in the discharge transistor. Due to the arrangement of the first discharge transistor on a cooling element the first discharge transistor can dissipate a considerably higher power. Thereby, on the whole, a more stable high-frequency amplifier assembly can be provided.

Further, within the framework of the present invention, a high-frequency generator, in particular for operating a plasma generator, is disclosed, comprising
   a high-frequency amplifier assembly according to the present invention;
   a control and/or regulating unit for controlling and/or regulating the signal generated by the signal generator; and
   a direct-voltage source for supplying the first amplifier transistor with an electric voltage.

The high-power generator can be designed for generating an output power of >100 W and preferably an output power of >1 kW.

In contrast to the prior art high-frequency generators, the high-frequency generator according to the invention offers a larger robustness and a longer service life.

Finally, the invention discloses a plasma system comprising
   a plasma generator for generating a plasma; and
   a high-frequency generator according to the present invention for operating the plasma generator.

BRIEF DESCRIPTION OF THE DRAWINGS

Hereunder the invention will be explained on the basis of the Figures in which.

DETAILED DESCRIPTION OF THE INVENTION

Figure 1:
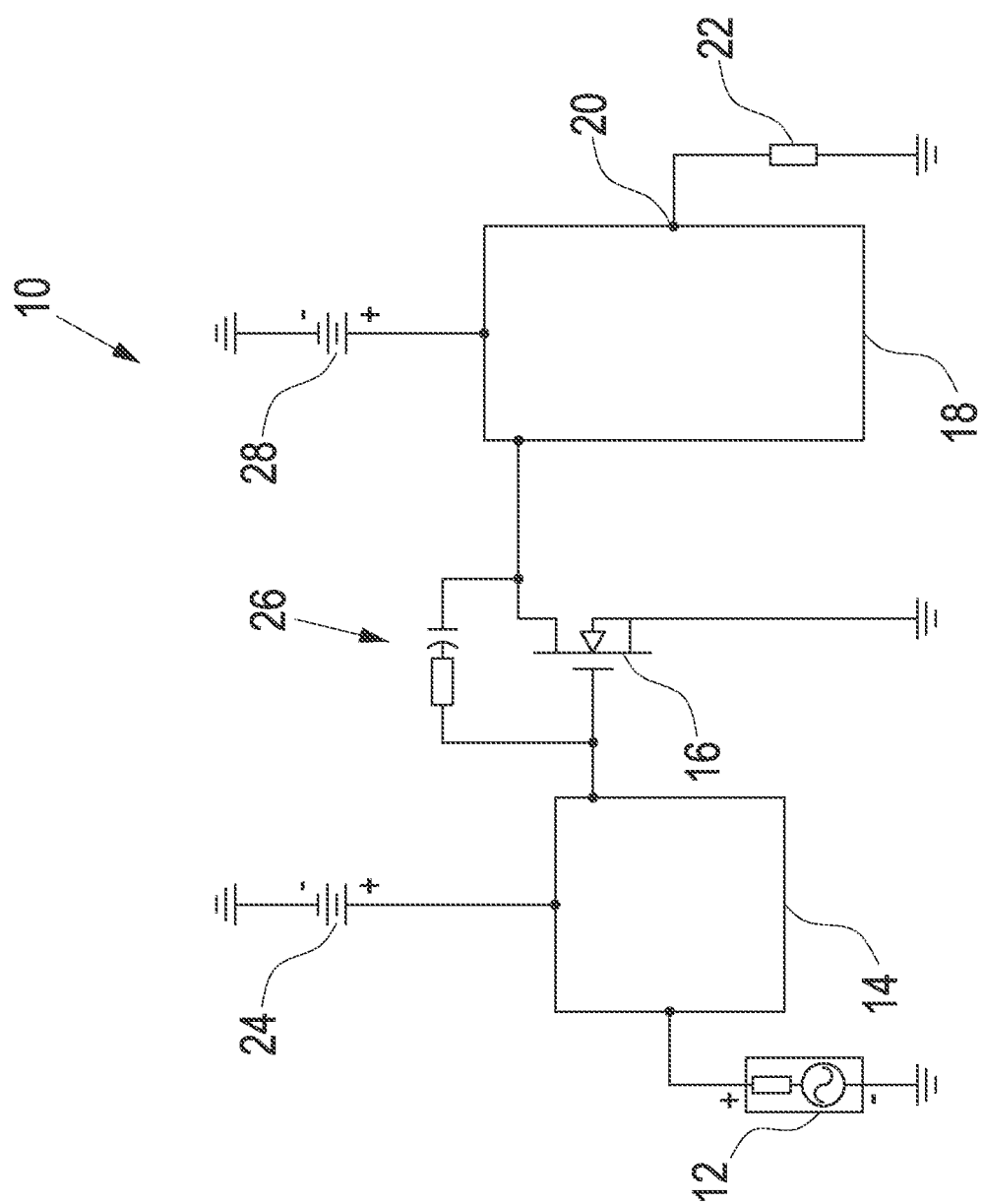
FIG. 1 shows a first embodiment of a prior art high-frequency amplifier assembly.

In FIG. 1 a first embodiment of a prior art high-frequency amplifier assembly 10 is shown. The high-frequency amplifier assembly 10 includes a signal generator 12 for generating a high-frequency signal. The high-frequency signal can typically have a frequency of 100 kHz to 200 MHz. The generated signal is provided at the input of an amplifier transistor 16 via an input network 14. The input network 14 can include a transformer (not shown in FIG. 1), for example. Alternatively or additionally to the transformer, the input network 14 can include coils, capacitors and/or resistors which can serve for impedance matching. The amplifier transistor 16 can in particular be a bipolar transistor or a field effect transistor (FET). It is particularly preferred that the amplifier transistor 16 is configured as a MOSFET as shown in FIG. 1. The latter can in particular be arranged in a common source circuit. In this case, the output of the input network 14 is connected to the gate terminal of the amplifier transistor 16, while the drain terminal of the amplifier transistor 16 is connected to the input of an output network 18. The output network 18 can include a transformer, for example. Alternatively or additionally to the transformer, the output network can include coils and/or capacitors which can serve for impedance matching. The output network 18 inverts the impedance of the external load 22 such that the impedance of typically 50Ω is converted to a considerably lower transistor impedance of 5Ω, for example, and the electrical length of the output network 18 between the drain and an output terminal 20 is approximately one quarter of the RF period. The output network 18 connects the amplifier transistor 16 to the output terminal 20 where an external load 22 is arranged. Furthermore, the high-frequency generator 11 includes a first voltage source 24 which serves for providing a gate bias voltage at the amplifier transistor 16. In some high-frequency amplifier assemblies 10, an additional stabilization circuit 26 can be provided which is arranged between the gate and the drain of the amplifier transistor 16. The stabilization circuit 26 serves for suppressing undesired vibrations of the amplifier transistor 16. As shown in FIG. 1, the stabilization circuit 26 illustrated here includes a resistor and a capacitor. Finally, the high-frequency generator 11 shown in FIG. 1 includes a second voltage source 28 which serves for supplying the amplifier transistor 16.

Figure 2:
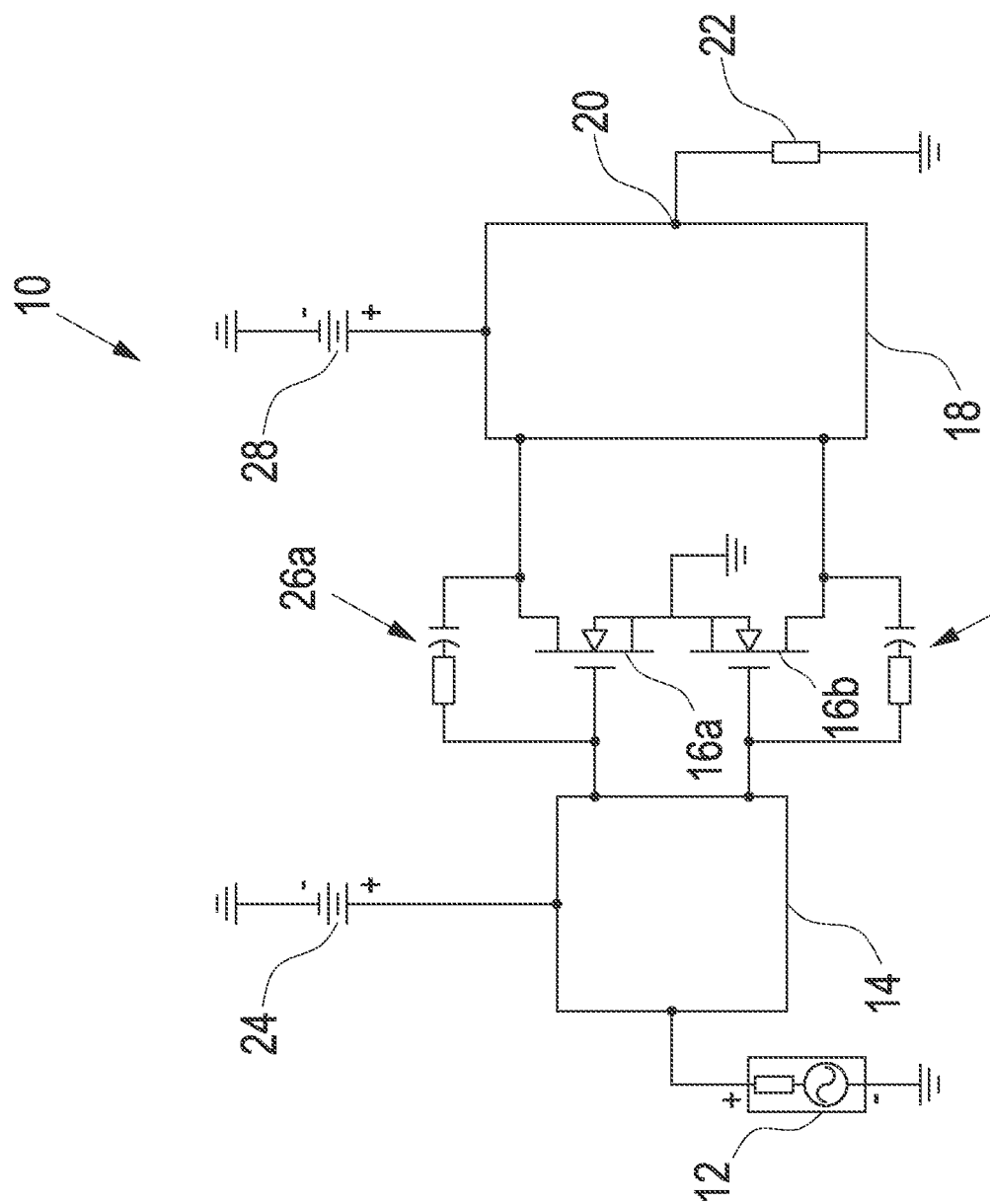
FIG. 2 shows a second embodiment of a prior art high-frequency amplifier assembly.

In FIG. 2 a second embodiment of a prior art high-frequency assembly 10 is illustrated where two amplifier transistors 16a, 16b are used. The two amplifier transistors 16a, 16b are configured as MOSFETs as in the embodiment shown in FIG. 1. The amplifier transistors 16a, 16b are connected to each other in a push-pull arrangement and are respectively arranged in a common source circuit.

Figure 3:
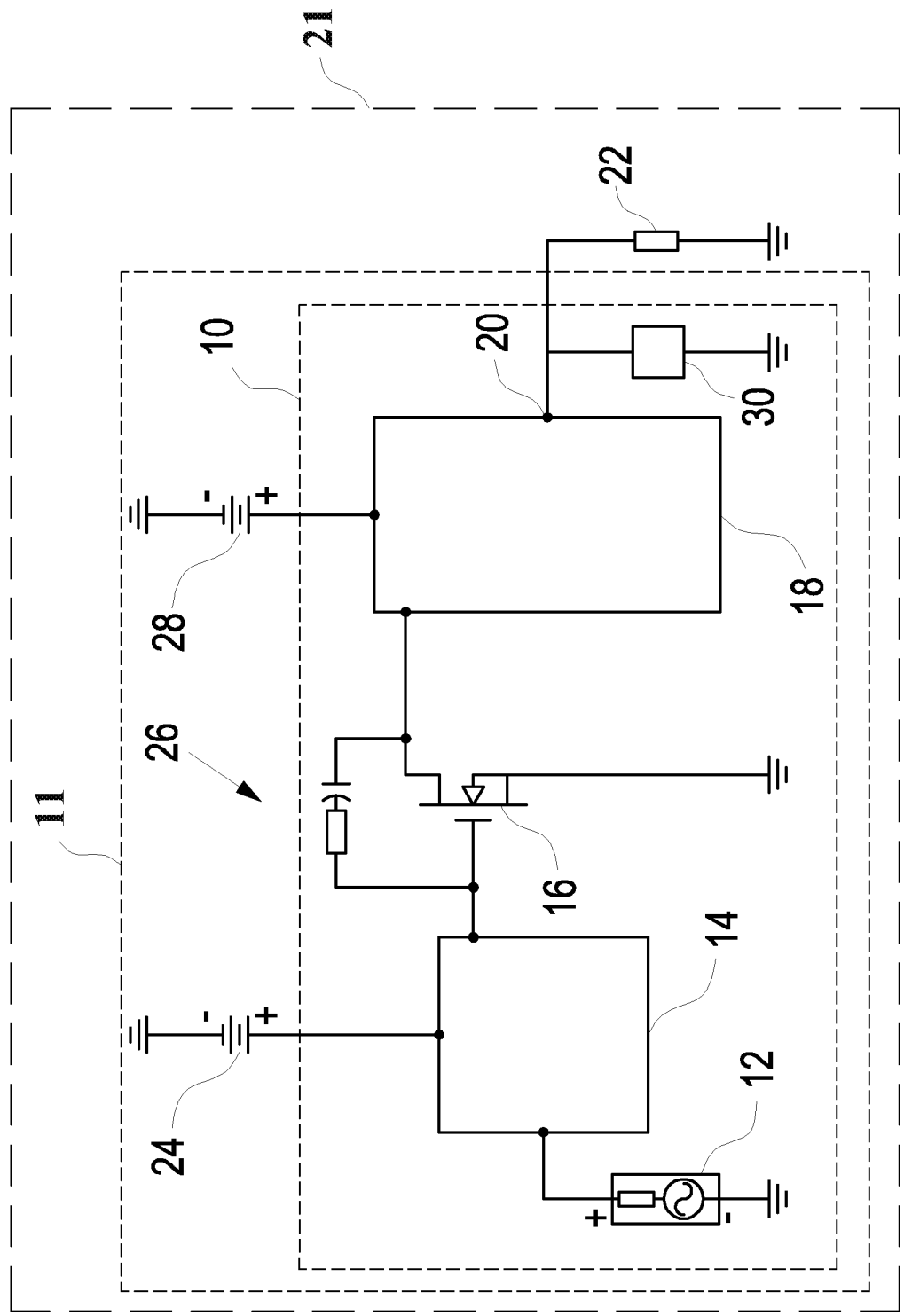
FIG. 3 shows an embodiment of the high-frequency amplifier assembly according to the invention.

In FIG. 3 a first exemplary embodiment of a plasma system 21 including a high-frequency generator 11 having a high-frequency amplifier assembly 10 according to the invention is illustrated. As compared to the prior art high-frequency amplifier assemblies 10, the high-frequency amplifier assembly 10 according to the invention includes an electronic voltage-limiting assembly 30 arranged at the output terminal 20 and serving for limiting the output voltage at the output terminal 20. The voltage-limiting assembly 30 is thus arranged in parallel to the external load 22 being a plasma generator which may include a plasma chamber containing a plasma. The voltage-limiting assembly 30 at the output terminal 20 allows for the impedance at the output of the output network 18 to be limited and thereby the drain impedance of the amplifier transistor 16 to be limited downwards. Thereby, an excessively high drain current, which may lead to a destruction or at least to a shorter service life of the amplifier transistor 16, is prevented from flowing through the amplifier transistor 16.

Figure 4:
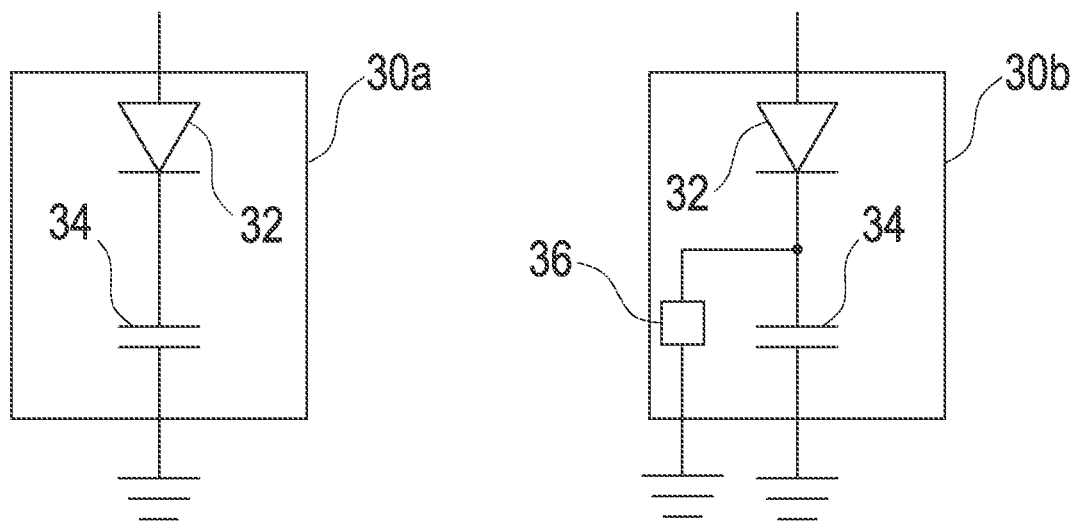
FIG. 4 shows various embodiments of the voltage-limiting assembly of the high-frequency amplifier assembly according to the invention.
Figure 4:
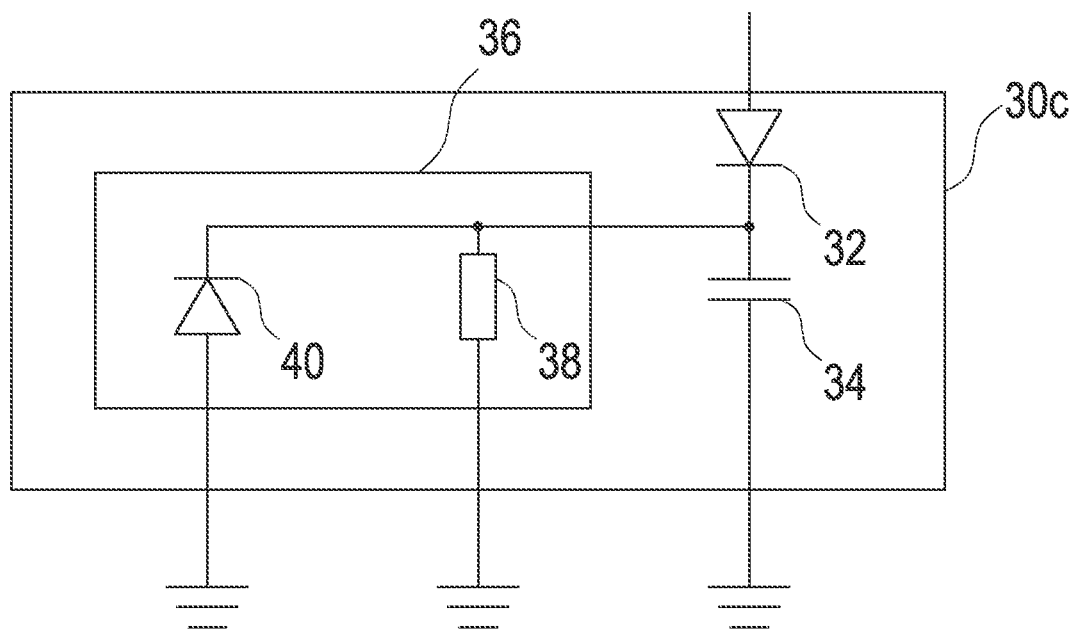

In FIGS. 4(a) to 4(c) various embodiments of the electronic voltage-limiting assembly 30a-30c are shown. According to a first exemplary embodiment, the voltage-limiting assembly 30a includes a rectifier diode 32 and a capacitor 34 series-connected to the rectifier diode 32. This arrangement allows for at least part of the voltage to drop via the capacitor 34 at least during the first half-wave of the voltage at the output terminal 20, and the capacitor 34 to be charged. Thereby, the voltage at the output terminal 20 is at least partially limited, whereby a sudden increase of the drain current at the amplifier transistor 16 is avoided or at least mitigated.

In addition, in FIG. 4(b) a further voltage-limiting assembly 30b is illustrated which includes, in addition to the components shown in FIG. 4(a), a discharge assembly 36 that is arranged in parallel to the capacitor 34. Usually, the capacitor 34 is configured such that it is completely charged after a few periods. Without a suitable discharge assembly, the capacitor 34 would only be able to limit the voltage at the output terminal 20 for a short time. The additional discharge assembly 36 allows for the capacitor 34 to be regularly discharged and thus to permanently contribute to a voltage limitation at the output terminal 20. As will be shown in conjunction with the following Figures, the discharge assembly 36 can in particular include an ohmic resistor or a voltage-dependent resistor (e.g. an avalanche diode or a varistor). The discharge assembly 36 allows for a significant improvement of the high-frequency amplifier assembly 10 since a permanent voltage limitation can be realized which can contribute to a considerable increase of the service life of the amplifier transistor 16 and thus the entire high-frequency assembly 10.

In FIG. 4(c) another exemplary embodiment of a voltage-limiting assembly 30c is illustrated. As shown in this Figure, the voltage-limiting assembly 30c can include a discharge assembly 36 which comprises an ohmic discharge resistor 38 and a discharge diode 40. Here, the discharge resistor 38 and the discharge diode 40 are arranged in parallel to each other as well as in parallel to the capacitor 34. Furthermore, the discharge diode 40 is arranged such that the cathode of the discharge diode 40 is connected to cathode of the rectifier diode 32. The arrangement of the voltage-limiting assembly 30c illustrated in FIG. 4(c) allows for the capacitor 34 to be charged during the positive half-wave of the voltage at the output terminal 20 and for this capacitor 34 to be discharged via the discharge resistor 38 and the discharge diode 40 such that the capacitor 34 can permanently contribute to the voltage limitation at the output terminal 20 during the positive half-wave of the voltage at the output terminal 20. Here, the combination of the discharge resistor 38 and the discharge diode 40 offers the advantage that a rapid discharge via the discharge diode 40 can be ensured when abruptly a particularly high voltage occurs at the output terminal, while a permanent discharge via the discharge resistor 38 can take place even when there is no particularly high voltage peak at the output terminal 20. Thus, a particularly advantageous discharge process for the capacitor 34 is provided.

Figure 5:
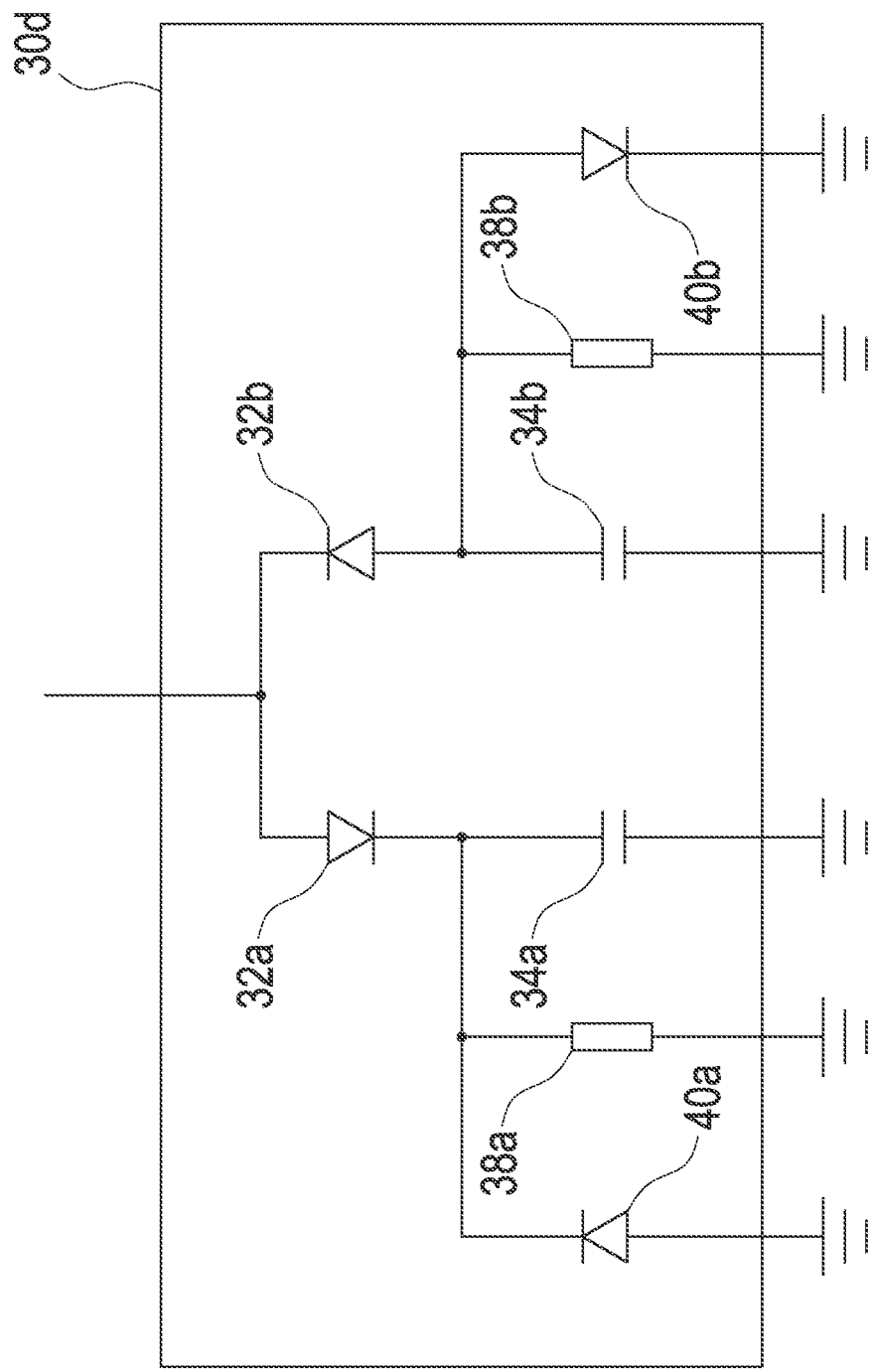
FIG. 5 shows another embodiment of the voltage-limiting assembly according to the invention.

In FIG. 5 another exemplary embodiment of the electronic voltage-limiting assembly 30d is illustrated. Here, the voltage-limiting assembly 30d includes a first subassembly which includes a first rectifier diode 32a, a first capacitor 34a, a first discharge resistor 38a connected in parallel to the first capacitor 34a and a first discharge diode 40a connected in parallel to the latter. The second subassembly includes a second rectifier diode 32b, a second capacitor 34b, a second discharge resistor 38b arranged in parallel to the second capacitor 34b and a second discharge diode 40b connected in parallel to the latter. The first subassembly serves for providing a voltage limitation during the positive half-wave of the voltage at the output terminal 20. Accordingly, the second subassembly serves for providing a voltage-limiting function during the negative half-wave of the voltage at the output terminal 20. The voltage-limiting assembly 30d is particularly advantageous since it provides a particularly efficient voltage-limiting function which can contribute to the voltage limitation during the entire periodic time of the high-frequency output voltage.

In FIG. 6 the profiles of the drain current of the amplifier transistor 16 (FIGS. 6A and 6C) as well as the voltage at the output terminal 20 (FIGS. 6B and 6D) are illustrated for the cases with (dashed lines) and without (continuous lines) voltage limitation. In the simulated profiles, a voltage-limiting assembly 30 which essentially corresponds to the voltage-limiting assembly 30d shown in FIG. 5 (but in contrast to the latter does not include any discharge resistors 38a, 38b) as well as a signal frequency of f=10 MHz and an output power of P=1500 watt were taken into account. The first rectifier diode 32a and the second rectifier diode 32b were assumed as ideal diodes (infinitely high breakdown voltage), while the breakdown voltages of the first discharge diode 40a and the second discharge diode 40b were taken into account as U_d=500 V in the simulation. Furthermore, the capacitance of the first capacitor 34a and the second capacitor 34b were assumed as C=1.0 nF.

Figure 6A:
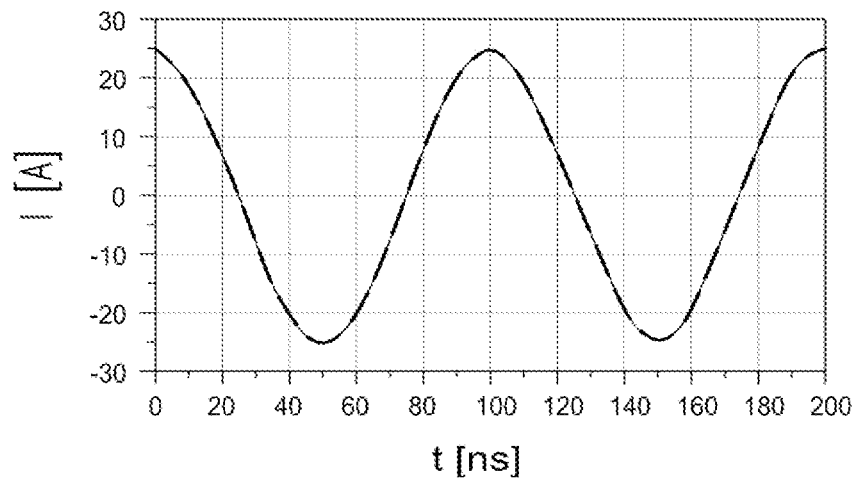
FIG. 6 shows the profile of the drain current of the amplifier transistor as well as the voltage at the output terminal.
Figure 6B:
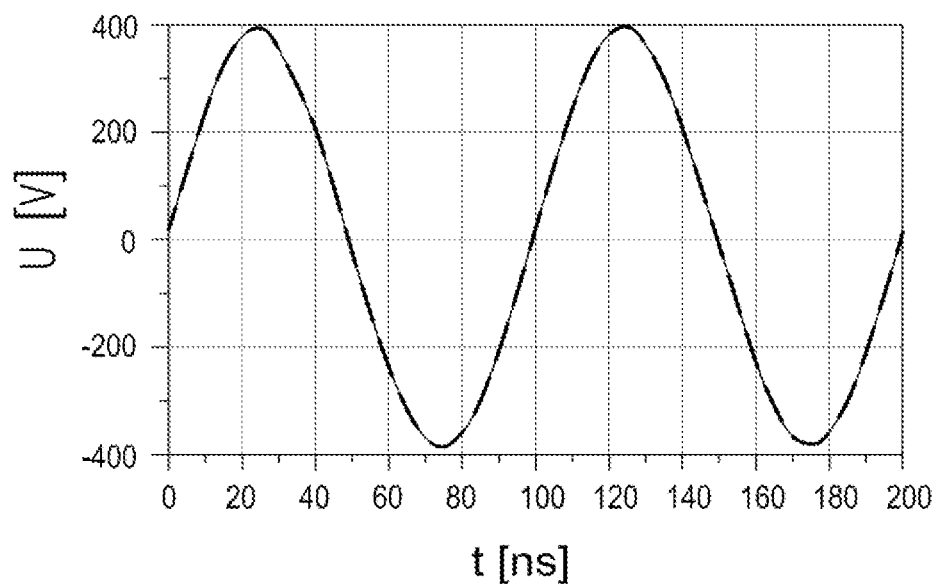

In FIGS. 6A and 6B, the simulation results for the drain current of the amplifier transistor 16 as well as for the voltage at the output terminal 20 for an operation at a load of 50Ω at the output are illustrated. Here, the continuous lines respectively show the case without a voltage-limiting assembly 30, while the dashed line illustrates the case with the voltage-limiting assembly 30 described above. As can be seen in FIG. 6A, the current profile is identical in both cases. Furthermore, in FIG. 6B the profile of the voltage at the output terminal 20 is illustrated. Also in this Figure, the continuous line shows the case without the voltage-limiting assembly 30, while the dashed line illustrates the case with the voltage-limiting assembly 30 described above. As can be seen in this Figure, too, the voltage-limiting assembly 30 does not change the profile of the voltage at the output terminal 20 in the case of an operation at a load of 50Ω.

Figure 6C:
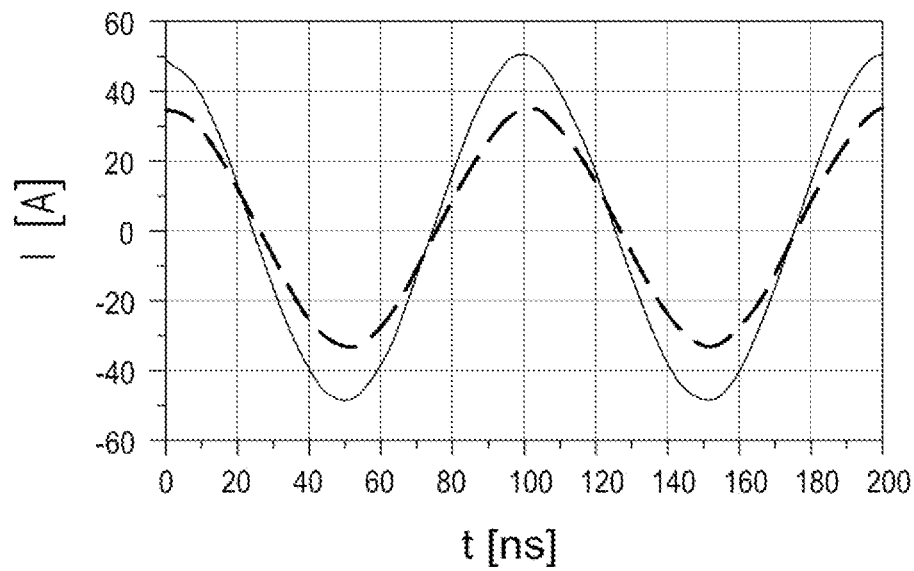
Figure 6D:
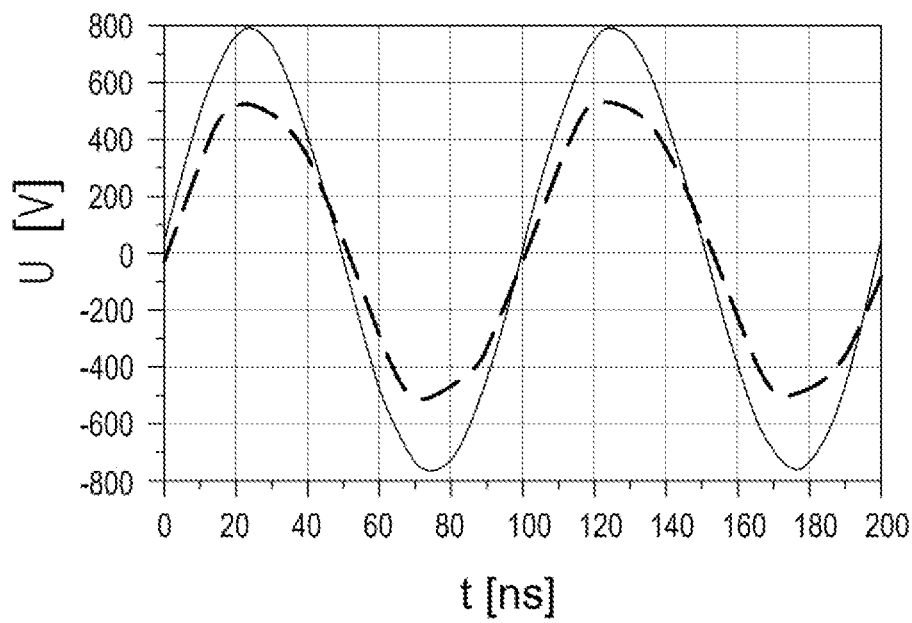

In FIGS. 6C and 6D the profile of the drain current of the amplifier transistor 16 and the voltage at the output terminal 20 for the case of an increased output impedance (operation with open output) is shown. Here, it can be seen in FIG. 6C that without the use of a voltage-limiting assembly 30 (continuous line) the current profile reaches nearly twice the amplitude as in the cases shown in FIGS. 6A and 6B (operation at 50Ω). Due to the use of the voltage-limiting assembly 30 the drain current of the amplifier transistor 16 is limited (dashed line). This results in a longer service life of the amplifier transistor 16 as well as the entire high-frequency assembly 10. Likewise, it can be seen in FIG. 6D that without the use of the voltage-limiting assembly 30 the output voltage increases to a peak value which is considerably higher than that shown in FIGS. 6A and 6B. Due to the use of the voltage-limiting assembly 30 a considerable limitation of the output voltage is attained. This allows for the drain current of the amplifier transistor 16 to be limited, too.

Figure 7:
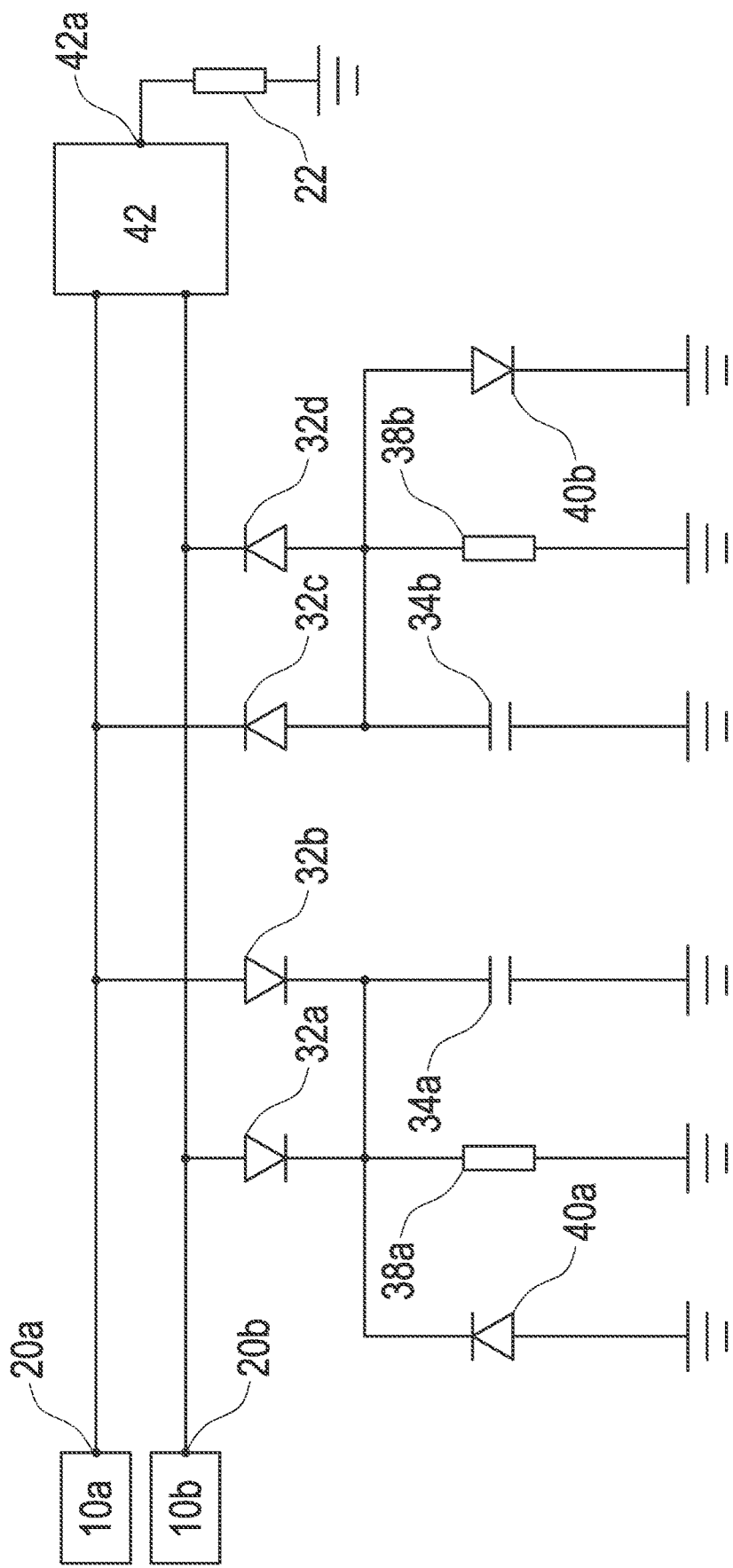
FIG. 7 shows another embodiment of the invention having a plurality of high-frequency amplifier assemblies and a power coupler.

In FIG. 7 another embodiment of the present invention is illustrated, where two high-frequency amplifier assemblies 10a, 10b are used. Here, the first high-voltage amplifier assembly 10a provides a first output signal at a first output terminal 20a and a second high-voltage amplifier assembly 10b provides a second output signal at a second output terminal 20b. Here, the output signal provided by the first high-frequency amplifier assembly 10a is limited by a first subassembly comprising the rectifier diode 32b as well as the capacitor 34a, the discharge resistor 38a and the discharge diode 40a, as well as by a second subassembly comprising the rectifier diode 32c, the capacitor 34b, the discharge resistor 38b and the discharge diode 40b. Here, the first subassembly serves for voltage limitation during the positive half-wave of the output voltage, while the second subassembly serves for voltage limitation during the negative half-wave of the output voltage. Similarly, the output voltage provided by the second high-frequency amplifier assembly 10b is limited by a subassembly comprising the rectifier diode 32a, the capacitor 34a, the discharge resistor 38a and the discharge diode 40a, as well as a subassembly comprising the rectifier diode 32d, the capacitor 34b, the discharge resistor 38b and the discharge diode 40b. The output powers of the individual high-frequency assemblies 10a, 10b are coupled by the power coupler 42. The exemplary embodiment of the invention illustrated in FIG. 7 offers the advantage that, when a plurality of high frequency amplifier assemblies 10a, 10b are combined with each other or are even operated independently of each other, the number of the electronic components required for voltage limitation is reduced. Thus, no separate capacitors 34a, 34b and no separate discharge resistors 38a, 38b and discharge diodes 40a, 40b, respectively, are required for each high-frequency amplifier assembly 10a, 10b. Instead, each of the aforementioned components can be used for voltage limitation of a plurality of high-frequency amplifier assemblies. As can be seen in FIG. 7, further components (such as the power coupler 42, for example) can be arranged between the output terminals 20a, 20b and the external load 22. Therefore, within the framework of the present invention, it is not absolutely necessary that an output terminal 20a, 20b or the voltage-limiting assembly 30 arranged at the output terminal 20a, 20b, respectively, is directly connected to the external load 22.

In FIG. 8 further exemplary embodiments of the discharge assemblies 36 of the high-frequency amplifier assembly 10 according to the invention are illustrated. In FIGS. 8A to 8D exemplary embodiments of discharge assemblies 36 are illustrated which can be used for voltage limitation during the positive half-wave of the voltage at the output terminal 20. In addition, in FIGS. 8E to 8H various exemplary embodiments of discharge assemblies 36 are illustrated which can be used for voltage limitation at the output terminal 20 during the negative half-waves. In FIGS. 8A to 8H the use of discharge transistors 44 is illustrated. The discharge transistors 44 can in particular be configured as bipolar transistors or MOSFETs. Furthermore, in the exemplary embodiments shown in FIGS. 8A to 8H the use of driving diodes 46 for driving the discharge transistor 44 is proposed. In the case of use of MOSFETs the threshold voltage is adjusted by resistance dividers.

For example, FIG. 8A shows a possible embodiment of a discharge assembly 36a using an npn bipolar transistor 44a and a driving diode 46a. The driving diode 46a can in particular be configured as an avalanche diode. As long as the voltage at the output terminal 20 is below a predefined threshold value, the discharge assembly 36a is not active. However, if the voltage at the output terminal 20 increases to a value which is higher than the predefined threshold value, the driving diode 46a switches to breakdown and the discharge transistor 44a changes into a conductive state. Consequently, the charged capacitor 34 can be discharged via the discharge transistor 44a. Instead of the driving diode 46a, a varistor can alternatively be used (not illustrated in FIG. 8A). The use of a discharge transistor 44a offers the advantage that a very high power can be dissipated. For example, it is possible to dissipate a power of several 100 watts using a power transistor. The operation of the power transistor can additionally be optimized by providing the power transistor with a cooling unit. For example, a power transistor can be arranged and cooled in a TO220, a TO247 or an ISOTOP housing for dissipating an adequate power quantity. Cooling of the power transistor can be carried out via a passive (a cooling body, for example) or an active (via forced ventilation or via cooling water, for example) cooling, for example.

Figure 8E:
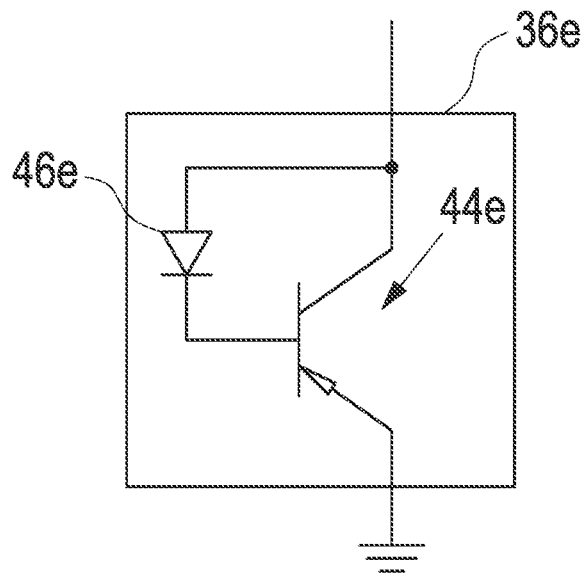
FIG. 8 shows various embodiments of the discharge assembly according to the invention.
Figure 8F:
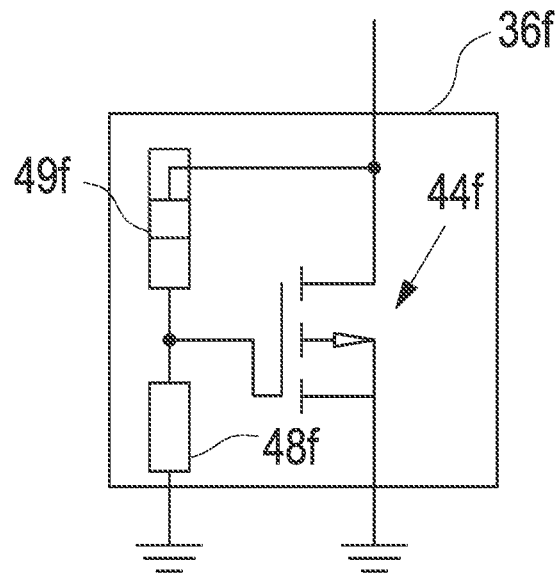
Figure 8G:
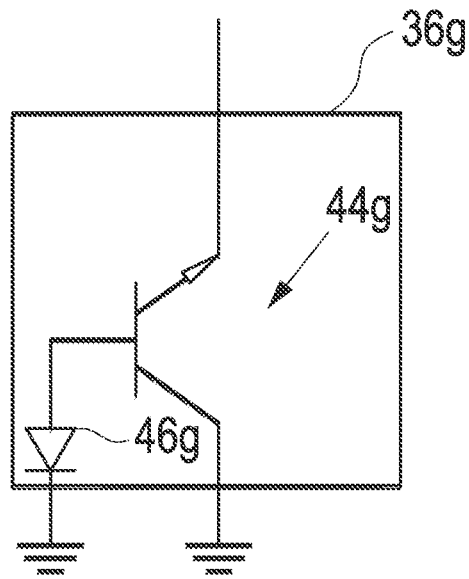
Figure 8H:
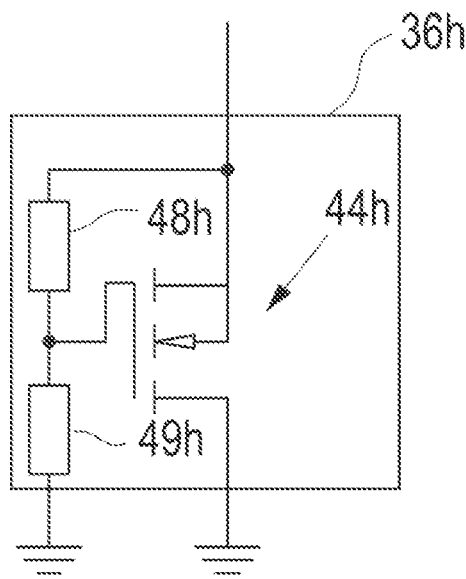

Similarly to the exemplary embodiment shown in FIG. 8A, the discharge assemblies 36 shown in FIGS. 8B to 8H can be used for discharging the capacitors 34.

Although very specific exemplary embodiments of the invention have been described with reference to the aforementioned Figures for illustrating the invention, it is apparent to one skilled in the art that the specific exemplary embodiments are not intended to restrict the scope of the present invention. Rather, they merely serve for illustrating the present invention.

The invention claimed is:
1. A high-frequency amplifier assembly for a high-frequency generator, comprising:
    a signal generator for generating a high-frequency signal;
    a first amplifier transistor for amplifying the high-frequency signal generated by the signal generator;
    an output terminal for outputting the amplified signal to an external load;
    an input network arranged between the signal generator and the first amplifier transistor for providing the high-frequency signal at the input of the first amplifier transistor;
    an output network arranged between the first amplifier transistor and the external load for providing a desired load impedance for the first amplifier transistor; and
    an electronic voltage-limiting assembly arranged at the output terminal for limiting the output voltage at the output terminal.
2. The high-frequency amplifier assembly according to claim 1, wherein the voltage-limiting assembly includes a first rectifier diode and a first capacitor arranged in series to the first rectifier diode.

3. The high-frequency amplifier assembly according to claim 2, wherein the voltage-limiting assembly includes a first discharge assembly arranged in parallel to the first capacitor for discharging the first capacitor.

4. The high-frequency amplifier assembly according to claim 3, wherein the first discharge assembly includes a first ohmic resistor for discharging the first capacitor.

5. The high-frequency amplifier assembly according to claim 4, wherein the first discharge assembly includes a first discharge diode for discharging the first capacitor.

6. The high-frequency amplifier assembly according to claim 5, wherein the first rectifier diode and the first discharge diode are arranged such that the cathode of the first rectifier diode is connected to the cathode of the first discharge diode or that the anode of the first rectifier diode is connected to the anode of the first discharge diode.

7. The high-frequency amplifier assembly according to claim 6, wherein the voltage-limiting assembly is connected to ground.

8. The high-frequency amplifier assembly according to claim 7, wherein the first capacitor has a capacitance which is larger than 10 pF and smaller than 100 nF, which preferably is larger than 100 pF and smaller than 10 nF, and which is in particular larger than 500 pF and smaller than 1 nF.

9. The high-frequency amplifier assembly according to claim 8,
wherein the voltage-limiting assembly includes two parallel-connected subassemblies wherein
a first subassembly comprises:
a first rectifier diode; and
a first parallel connection being serially connected to the first
rectifier diode and comprising a first capacitor and a first discharge assembly, wherein the cathode of the first rectifier diode is connected to the first parallel connection; and
a second subassembly comprises:
a second rectifier diode; and
a second parallel connection being serially connected to the second
rectifier diode and comprising a second capacitor and a second discharge assembly, wherein the anode of the second rectifier diode is connected
to the second parallel connection.

10. The high-frequency amplifier assembly according to claim 9, wherein the first discharge assembly includes a varistor for discharging the first capacitor or consists exclusively of a varistor for discharging the first capacitor.

11. The high-frequency amplifier assembly according to claim 10, wherein the first discharge assembly includes a first discharge transistor for discharging the first capacitor and a driving diode for driving the first discharge transistor.

12. The high-frequency amplifier assembly according to claim 11, wherein the first discharge transistor is configured as an npn bipolar transistor, wherein the anode of the driving diode is connected to the basis of the npn bipolar transistor and the cathode of the driving diode is connected to the collector of the npn bipolar transistor.

13. The high-frequency amplifier assembly according to claim 12, wherein the first discharge assembly includes a first discharge transistor which is configured as an nMOS transistor, wherein the gate voltage of the nMOS transistor is provided via a resistance divider comprising two resistors.

14. The high-frequency amplifier assembly according to claim 13, wherein the first discharge transistor is arranged on a cooling element which is provided for dissipating heat generated in the discharge transistor.

15. A high-frequency generator, comprising:
a high-frequency amplifier assembly according to claim 1;
a control and/or regulating unit for controlling and/or regulating the high-frequency signal generated by the signal generator; and
a direct-voltage source for supplying the first amplifier transistor with an electric voltage.

16. A plasma system, comprising:
a plasma generator; and
a high-frequency generator according to claim 15 for operating the plasma generator.

* * * * *